(12) United States Patent
Hertzberg et al.

(10) Patent No.: US 11,734,597 B2
(45) Date of Patent: Aug. 22, 2023

(54) FREQUENCY ALLOCATION IN MULTI-QUBIT CIRCUITS

(71) Applicant: International Business Machines Corporation, Armonk, NY (US)

(72) Inventors: Jared Barney Hertzberg, Westchester, NY (US); Sami Rosenblatt, White Plains, NY (US); Easwar Magesan, Mount Kisco, NY (US); John Aaron Smolin, Yorktown, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 96 days.

(21) Appl. No.: 17/240,095

(22) Filed: Apr. 26, 2021

(65) Prior Publication Data

US 2021/0241161 A1   Aug. 5, 2021

Related U.S. Application Data

(60) Division of application No. 16/552,365, filed on Aug. 27, 2019, now Pat. No. 11,010,685, which is a
(Continued)

(51) Int. Cl.
*G06N 10/00* (2022.01)
*H10N 99/00* (2023.01)
(Continued)

(52) U.S. Cl.
CPC ......... *G06N 10/00* (2019.01); *G06F 13/4068* (2013.01); *H10N 99/05* (2023.02); *B82Y 10/00* (2013.01)

(58) Field of Classification Search
CPC ... G06N 10/00; G06F 13/4068; H01L 49/006; B82Y 10/00; H10N 99/05
(Continued)

(56) References Cited

U.S. PATENT DOCUMENTS 6,960,780 B2   11/2005   Blais et al.
6,987,793 B2   1/2006    Dhar et al.
(Continued)

FOREIGN PATENT DOCUMENTS

EP   2 863 342 A3    3/2016
JP   H11-330449 A    11/1999
(Continued)

OTHER PUBLICATIONS

Notice of Allowance received for U.S. Appl. No. 16/002,817 dated May 13, 2019, 23 pages.
(Continued)

*Primary Examiner* — Tu-Tu V Ho
(74) *Attorney, Agent, or Firm* — Amin, Turocy & Watson, LLP

(57) ABSTRACT

Techniques facilitating frequency allocation in multi-qubit circuits are provided. In one example, a computer-implemented method comprises determining, by a device operatively coupled to a processor, an estimated fabrication yield associated with respective qubit chip configurations by conducting simulations of the respective qubit chip configurations at respective frequency offsets; and selecting, by the device, a qubit chip configuration from among the respective qubit chip configurations based on the estimated fabrication yield associated with the respective qubit chip configurations.

20 Claims, 18 Drawing Sheets

Related U.S. Application Data continuation of application No. 16/002,817, filed on Jun. 7, 2018, now Pat. No. 10,423,888.

(51) Int. Cl.
*G06F 13/40* (2006.01)
*B82Y 10/00* (2011.01)

(58) Field of Classification Search
USPC .......................................................... 257/31
See application file for complete search history.

(56) References Cited

U.S. PATENT DOCUMENTS

| | | |
|---|---|---|
| 8,872,360 B2 | 10/2014 | Chow et al. |
| 9,588,940 B2 | 3/2017 | Hamze et al. |
| 10,140,404 B2 | 11/2018 | Rigetti et al. |
| 10,423,888 B1 | 9/2019 | Hertzberg et al. |
| 2009/0015447 A1 | 1/2009 | Kilbank |
| 2016/0267032 A1 | 9/2016 | Rigetti et al. |
| 2017/0228483 A1 | 8/2017 | Rigetti et al. |

FOREIGN PATENT DOCUMENTS

| | | |
|---|---|---|
| JP | 2005-513680 A | 5/2005 |
| WO | 2017/078731 A1 | 5/2017 |

OTHER PUBLICATIONS

Andersen et al., "Multi-frequency modes in superconducting resonators: Bridging frequency gaps in off-resonant Couplings", Oct. 27, 2014, 9 pages.
U.S. Appl. No. 16/449,976, filed Jun. 24, 2019.
Appendix P—List of IBM Patents or Applications treated as related.
International Search Report and Written Opinion received for PCT Application Serial No. PCT/EP2019/063774 dated Sep. 6, 2019, 19 pages.
Hutchings et al., "Tunable Superconducting Qubits with Flux-Independent Coherence", Department of Physics, Syracuse University, Oct. 12, 2017, 13 pages.
Chow et al., "Characterizing a four-Qubit Planar Lattice for Arbitrary Error Detection", Visual Communications and Image Processing, vol. 9500, May 21, 2015, 9 pages.
Non Final Office Action received for U.S. Appl. No. 16/552,365 dated Jul. 2, 2020, 36 pages.
Final Office Action received for U.S. Appl. No. 16/552,365 dated Dec. 2, 2020, 16 pages.
U.S. Appl. No. 16/552,365, filed Aug. 27, 2019.
U.S. Appl. No. 16/002,817, filed Jun. 7, 2018.
Decision to Grant received for JP Patent Application Serial No. 2020-554894 dated Aug. 17, 2022, 2 pages.

US 11,734,597 B2

FREQUENCY ALLOCATION IN MULTI-QUBIT CIRCUITS

BACKGROUND

The subject disclosure relates to quantum computing, and more specifically, to techniques facilitating circuit design and fabrication for quantum computers.

As computer technology advances and conventional computing devices decrease in physical scale, a growing interest has been placed on quantum computing as a technique by which computing technology can continue to advance past the physical limitations of traditional computers. A quantum computer can operate via superconducting quantum logic circuits, which can include arrays of transmon qubits, capacitively shunted flux qubits (CSFQ), and/or other types of superconducting qubits linked by quantum buses. Cross-resonance (CR) gate operations in the circuit enable the implementation of quantum logic gates between qubits in the circuit. However, CR gates are sensitive to the relative frequencies of their corresponding qubits, and the behavior of respective qubits can define windows of relative frequencies for functional gates as well as collision windows, i.e., ranges of relative frequencies which can cause gate errors. For instance, as disclosed by Rigetti et al., "PROCESSING SIGNALS IN A QUANTUM COMPUTING SYSTEM," U.S. Patent Application Publication No. 2016/0267032 A1 (reference numerals omitted), "[an] example quantum computing system includes multiple operating domains. Each of the operating domains can include dedicated hardware at one or more stages of the quantum computing system." With respect to this example, Rigetti et al. further discloses that "the quantum processor includes an array of qubit devices, and each operating domain includes a particular group of the qubit devices and the associated devices and other hardware that operate in connection with the particular group of qubit devices. The devices in each group have distinct operating frequencies . . . . " Rigetti et al. additionally discloses that "each qubit device and its corresponding readout device operate within a frequency band, and the frequency band for each qubit and readout device pair is separate and distinct (non-overlapping) with the frequency band for the other qubit and readout device pairs within the same operating domain."

Due to uncontrollable variations and/or imperfections in nano-structures utilized during device fabrication, the frequency of single-junction qubits cannot be precisely set or controlled. As a result, in a given lattice of fixed-frequency qubits employing CR gates, a significant number of frequency collisions can exist that can adversely impact the performance of the respective qubits. In view of at least the above, there exists a need in the art for techniques to accommodate frequency imprecision associated with qubit circuit fabrication.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, computer-implemented methods, apparatus and/or computer program products that facilitate frequency allocation in multi-qubit circuits are described.

According to an embodiment, a system can include a memory that stores computer executable components and a processor that executes computer executable components stored in the memory. The computer executable components can include a yield determination component that determines an estimated fabrication yield associated with respective qubit chip configurations by conducting simulations of the respective qubit chip configurations at respective frequency offsets. The computer executable components can further include a selection component that selects a qubit chip configuration from among the respective qubit chip configurations based on the estimated fabrication yield associated with the respective qubit chip configurations. In certain embodiments, the computer executable components can additionally include a configuration component that generates the respective qubit chip configurations such that the qubit chip configurations differ from each other with respect to at least one of a geometric configuration or a frequency configuration. The geometric configuration can include at least one of total number of qubits, functionality of respective qubits, or a number of qubits per bus. The frequency configuration can include at least one of operational frequency ranges for respective qubits or anharmonicity parameters associated with the respective qubits. In certain other embodiments, the yield determination component can count frequency collisions occurring for the respective qubit chip configurations during the simulations and determine the estimated fabrication yield based on a number of the frequency collisions, and by doing so can facilitate adjustment of the respective qubit chip configurations by the yield determination component to account for the frequency collisions. The yield determination component can also define frequency collision windows for respective qubits in the respective qubit chip configurations and count the frequency collisions according to the frequency collision windows. In still other embodiments, the respective qubit chip configurations can include one or more of fixed-frequency qubits or tunable-frequency qubits. In further embodiments, the computer executable components can further include a fabrication component that fabricates a superconducting qubit chip according to the qubit chip configuration selected by the selection component, where the qubit chip configuration selected by the selection component results in improved resilience of the superconducting qubit chip to imperfections in fabrication by the fabrication component.

According to another embodiment, a computer-implemented method can include determining, by a device operatively coupled to a processor, an estimated fabrication yield associated with respective qubit chip configurations by conducting simulations of the respective qubit chip configurations at respective frequency offsets, and selecting, by the device, a qubit chip configuration from among the respective qubit chip configurations based on the estimated fabrication yield associated with the respective qubit chip configurations. In certain embodiments, the method can further include generating, by the device, the respective qubit chip configurations such that the qubit chip configurations differ from each other with respect to at least one of total number of qubits, functionality of respective qubits, or a number of qubits per bus. In certain other embodiments, the method can further include generating, by the device, the respective qubit chip configurations such that the qubit chip configurations differ from each other with respect to at least one of operational frequency ranges for respective qubits or anharmonicity parameters associated with the respective qubits. In further embodiments, the determining can include counting, by the device, frequency collisions occurring for the respective qubit chip configurations during the simulations, and determining, by the device, the estimated fabrication yield based on a number of the frequency collisions. The method in some embodiments can also include fabricating, by the device, a superconducting qubit chip according to a selected qubit chip configuration resulting from the selecting.

According to a further embodiment, a computer program product for designing a superconducting qubit chip can include a computer readable storage medium having program instructions embodied therewith. The program instructions can be executable by a processing component to cause the processing component to determine an estimated fabrication yield associated with respective qubit chip configurations by conducting simulations of the respective qubit chip configurations at respective frequency offsets and select a qubit chip configuration from among the respective qubit chip configurations based on the estimated fabrication yield associated with the respective qubit chip configurations. In certain embodiments, the program instructions can further cause the processor to generate the respective qubit chip configurations such that the qubit chip configurations differ from each other with respect to at least one of geometric configuration or frequency configuration. Also or alternatively, the program instructions can further cause the processor to count frequency collisions occurring for the respective qubit chip configurations during the simulations and determine the estimated fabrication yield based on a number of the frequency collisions.

According to an additional embodiment, a system can include a memory that stores computer executable components and a processor that executes computer executable components stored in the memory. The computer executable components can include a performance analysis component that determines operation metrics for respective qubit chip features by analyzing simulated performance of the respective qubit chip features at respective frequency offsets. The computer executable components can also include a design generation component that generates a superconducting qubit chip design using one or more of the respective qubit chip features based on corresponding ones of the operation metrics determined by the performance analysis component. In certain embodiments, the respective qubit chip features can include at least one of total number of qubits, functionality of respective qubits, or a number of qubits per bus. Also or alternatively, the respective qubit chip features can include at least one of operational frequency ranges for respective qubits or anharmonicity parameters associated with the respective qubits. In other embodiments, the computer executable components can further include a collision monitoring component that defines frequency collision windows for respective qubits corresponding to the qubit chip features. The collision monitoring component can identify collisions between the respective qubits based on the frequency collision windows. In still other embodiments, the computer executable components can comprise a fabrication component that fabricates a superconducting qubit chip according to the superconducting qubit chip design generated by the design generation component, where the superconducting qubit chip design generated by the design generation component results in improved resilience of the superconducting qubit chip to imperfections in fabrication by the fabrication component.

According to yet another embodiment, a computer-implemented method can include determining, by a device operatively coupled to a processor, operation metrics for respective qubit chip features by analyzing simulated performance of the respective qubit chip features at respective frequency offsets, and generating, by the device, a superconducting qubit chip design using one or more of the respective qubit chip features based on their respectively corresponding operation metrics. In certain embodiments, the determining can include defining, by the device, frequency collision windows for respective qubits corresponding to the qubit chip features, and identifying, by the device, collisions between respective qubits based on the frequency collision windows. In certain other embodiments, the generating can result in a generated superconducting qubit chip design, and the method can further include fabricating, by the device, a superconducting qubit chip according to the generated superconducting qubit chip design.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Figure 1:
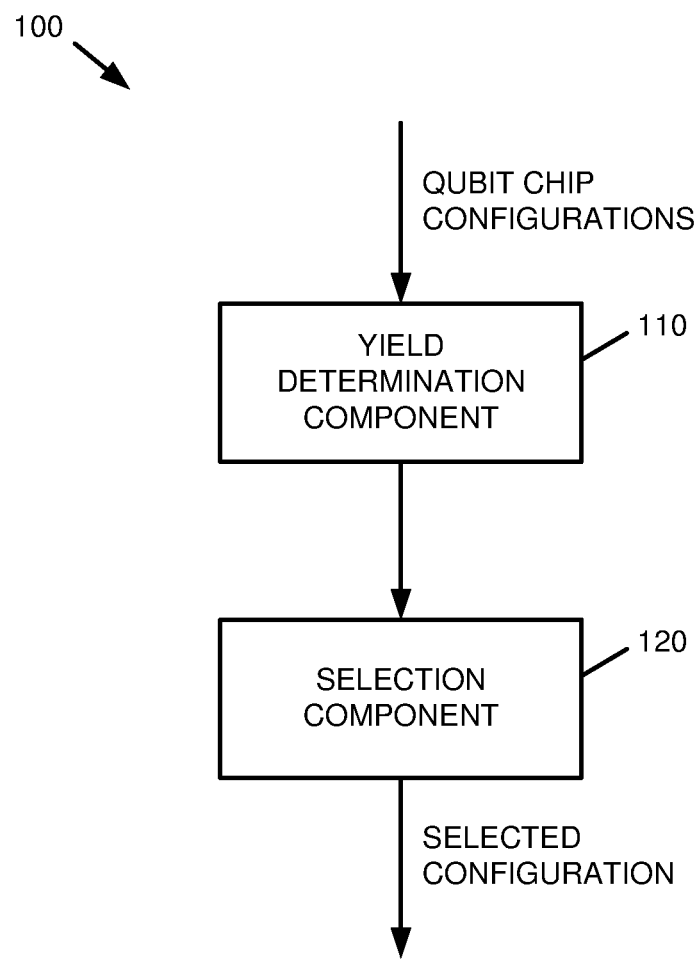
FIG. 1 is a block diagram of a system that facilitates frequency allocation in multi-qubit circuits according to one or more embodiments described herein.

With reference now to the drawings, FIG. 1 illustrates a block diagram of a system 100 that facilitates frequency allocation in multi-qubit circuits according to one or more embodiments described herein. Repetitive description of like elements employed in other embodiments described herein is omitted for sake of brevity. As shown in FIG. 1, system 100 includes a yield determination component 110 that determines an estimated fabrication yield associated with respective qubit chip configurations by conducting simulations of the respective qubit chip configurations at respective frequency offsets. In an aspect, the yield determination component 110 can utilize one or more statistical models that take into account the likelihood of frequency collisions between respective qubits in a given circuit to optimize qubit frequencies, qubit couplings, and/or other circuit parameters.

Figure 2:
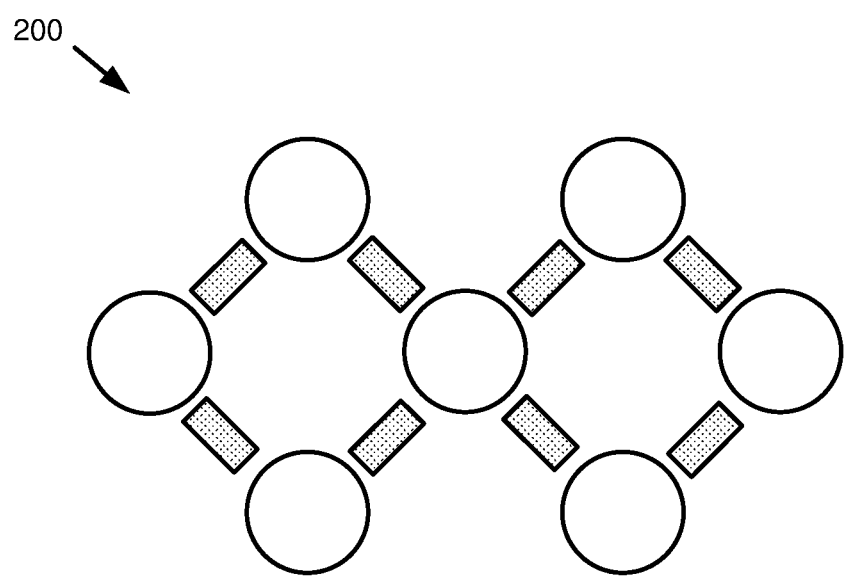
FIG. 2 is a diagram illustrating an example qubit configuration that can be analyzed according to various embodiments described herein.

An example of a qubit circuit that can be analyzed by system 100 is shown by diagram 200 in FIG. 2. As shown by diagram 200, the respective qubits can be joined by respective quantum buses, here quantum buses that can be utilized to link two qubits per bus. Other bus configurations are also possible, as will be described in further detail below. In an aspect, the quantum buses of the qubit circuit shown in diagram 200 can be utilized to implement respective quantum gates between their respectively connected qubits. A specific, non-limiting example of a quantum gate that can be employed in the circuit shown by diagram 200 is a cross-resonance (CR) gate as described in Chow et al., "MULTIPLE-QUBIT WAVE-ACTIVATED CONTROL GATE," U.S. Pat. No. 8,872,360, the entirety of which is hereby incorporated by reference. Other quantum gates could also be used.

In an aspect, qubits in a multi-qubit circuit, such as those shown by diagram 200, can operate at different frequencies such that respective qubits in the system can be addressed by a quantum computer via their frequencies. However, if the frequencies of two or more qubits that are near each other physically (e.g., connected via the same quantum bus, etc.) are such that their frequencies result in a collision, the ability of the quantum computer to address individual ones of the qubits can be adversely impacted, resulting in degraded performance of the system. To mitigate this impact to system performance, respective qubits in a circuit can be designed such that respective qubits connected via a quantum bus and/or other means each operate at non-colliding frequencies. However, as noted above, imperfections in the qubit fabrication process can in some cases result in one or more qubits operating at frequencies other than their respective intended frequencies, which can in turn potentially result in frequency collisions between respective qubits in spite of the intended system design.

In an aspect, the yield determination component 110 can utilize a statistical model that includes one or more empirical inputs and one or more design inputs to reduce the amount of frequency collisions within a given multi-qubit circuit. By way of non-limiting example, empirical inputs to a statistical model as used by the yield determination component 110 can include collision window definitions, which can be determined via quantum modeling, measurement, and/or other techniques. Respective collision window definitions that can be utilized are described in further detail below with respect to FIG. 6. Also or alternatively, the empirical inputs can include a measured statistical distribution of qubit frequencies. Various examples of distributions that can be utilized in this manner are described in further detail below with respect to FIGS. 7-8.

By way of further specific, non-limiting example, design inputs to the statistical model can include the number of qubits in the circuit, the geometric arrangement of qubits in the circuit, and/or the function of the various qubits in the circuit, e.g., their use as data or ancilla in quantum error correction algorithms. One example of these design parameters is illustrated by the circuit shown in diagram 200, as described above. Further examples of these parameters are described in further detail below with respect to FIGS. 4-5.

As a further example, the design inputs can include the type(s) of respective qubits in the circuit, e.g., transmon, phase qubit, flux qubit, and/or another type of superconducting qubit. An additional example design input can include qubit anharmonicity, which is the deviation in frequency (e.g., in GHz or MHz) of a qubit or system of qubits from harmonic oscillation. Further example design inputs can include number of qubits per bus, intended qubit frequencies (e.g., given in GHz), desired fidelities for CR gates and/or other quantum gates, etc. Respective ones of the above-noted design inputs are described in further detail below.

In an aspect, the yield determination component 110 can model a multi-qubit circuit based on one or more of the above inputs to analyze performance of the circuit under various qubit frequency offsets, e.g., deviation from respective qubit frequencies as caused by fabrication error and/or other causes. As further shown by FIG. 1, system 100 further includes a selection component 120 that selects a qubit chip configuration from among the respective qubit chip configurations based on the estimated fabrication yield associated with the respective qubit chip configurations as determined by the yield determination component 110, e.g., via the statistical model constructed by the yield determination component 110.

In an aspect, system 100 can improve the resilience of a multi-qubit circuit to frequency variations introduced during the fabrication process. By implementing the frequency allocation scheme corresponding to system 100, performance of multi-qubit circuits and their respectively corresponding quantum computers can be improved, the fabrication yield of manufactured circuits can be improved, efficiency of multi-qubit circuit fabrication can be improved (e.g., by reducing the time and/or cost of fabricating physical circuits via mitigating frequency collisions in modeling and/or simulation as opposed to physical fabrication itself), and/or other benefits or advantages can be realized.

Figure 3:
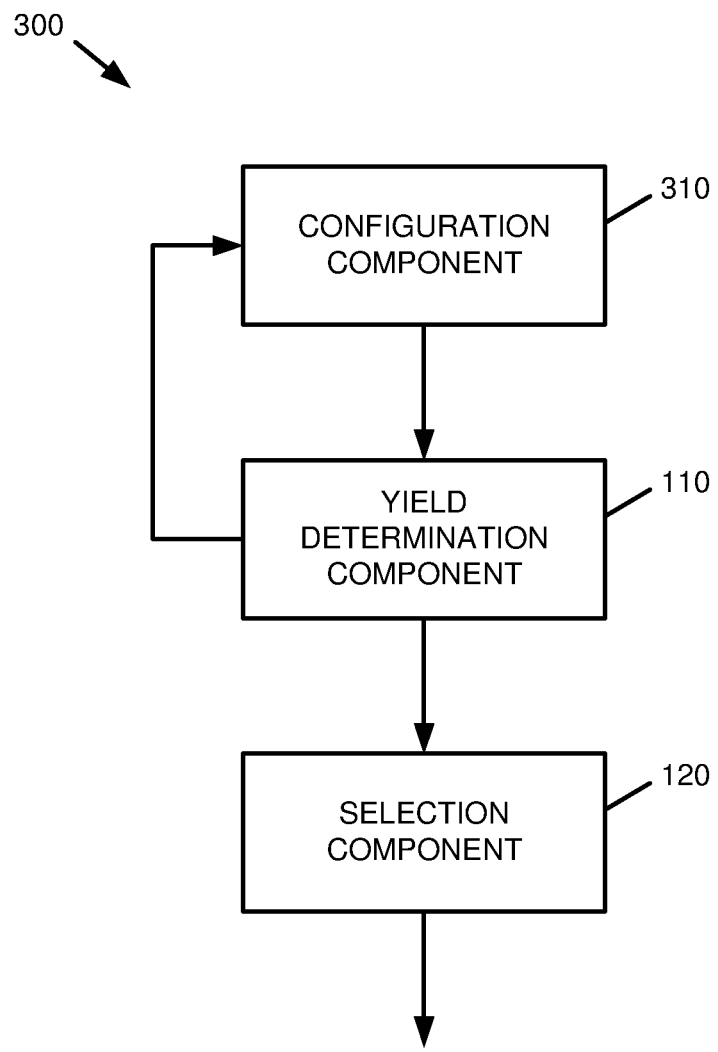
FIG. 3 is a block diagram of a system that facilitates qubit configuration for a multi-qubit circuit according to one or more embodiments described herein.

With reference next to FIG. 3, a block diagram of a system 300 that facilitates qubit configuration for a multi-qubit circuit according to one or more embodiments described herein is illustrated. Repetitive description of like elements employed in other embodiments described herein is omitted for sake of brevity. As shown in FIG. 3, system 300 includes a configuration component 310 that generates the respective qubit chip configurations utilized by the yield determination component 110 as described with respect to FIG. 1 above such that the qubit chip configurations differ from each other with respect to at least one of geometric configuration or frequency configuration.

In an aspect, the geometric configuration of a multi-qubit circuit can be defined at least in part by the total number of qubits in the circuit, the functionality of the respective qubits in the circuit (e.g., data or ancilla), and/or the number of qubits per bus in the circuit. By way of non-limiting example, the circuit illustrated by diagram 200 as described above contains 7 qubits that are linked via respective two-qubit buses, resulting in 8 gate pairs and qubit pairs. In another non-limiting example illustrated by diagram 400 in FIG. 4, the eight two-qubit buses shown by diagram 200 can be replaced by two four-qubit buses, resulting in a configuration that offers twelve bus-coupled qubit pairs. The circuit shown by diagram 400 can employ two-qubit gates on the same eight pairs available in the circuit shown by diagram 200, while having an additional 4 pairs available for gates. However, even if no gates are performed on these additional pairs, the presence of these connections can in some cases degrade circuit performance through frequency collisions among them. In a further non-limiting example illustrated by diagram 500 in FIG. 5, a multi-qubit circuit can contain 16 qubits linked via respective two-qubit buses, resulting in a configuration that includes 22 gate pairs and qubit pairs.

Figure 4:
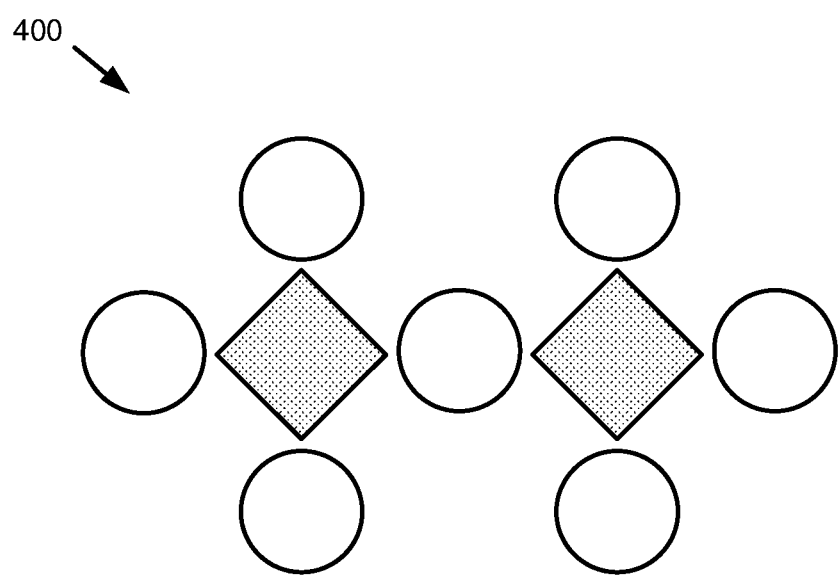
FIGS. 4-5 are diagrams illustrating respective additional example qubit configurations that can be analyzed according to various embodiments described herein.
Figure 5:
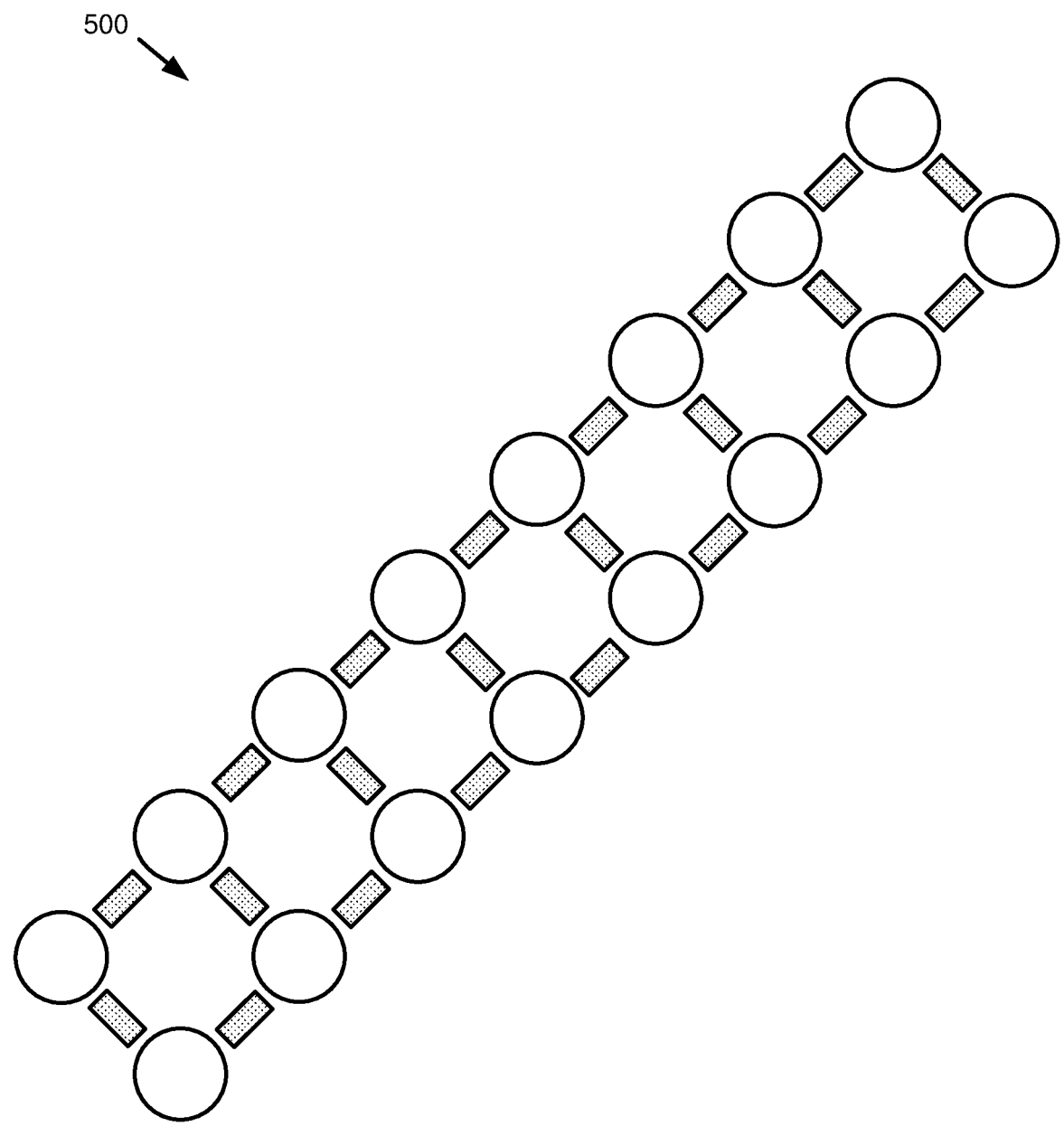

Other geometric qubit configurations are possible. For instance, a multi-cubit circuit could contain different numbers of qubits, types of qubits (e.g., data or ancilla; transmon, CSFQ and/or other qubits; etc.), number of qubits per bus, or the like. A given circuit could also include mixes of different configurations. For instance, a circuit could include some qubits linked via two-qubit buses as shown by FIGS. 2 and 5 as well as other qubits linked via four-qubit buses as shown by FIG. 4. While not shown, other bus types, such as three-qubit buses or the like, could also be used in addition to, or in place of, the bus types described above. In still another non-limiting example, qubit configurations can vary in terms of physical qubit placement. For instance, in place of the configuration shown in FIG. 5 that includes 2 rows of 8 qubits, the qubits could instead be placed in a square configuration of 4 rows of 4 qubits and/or in any other suitable configuration. Other configurations to those described above could also be used. Any number of qubits in any geometric arrangement can be incorporated into the circuit configuration as desired for a given quantum computing application. For instance, a circuit containing 400 qubits could comprise 2 rows of 200 qubits, or 20 rows of 20 qubits, employing 2 qubits per bus or 4 qubits per bus or some combination of 2 and 4 qubits per bus in a specified geometric arrangement.

Figure 6:
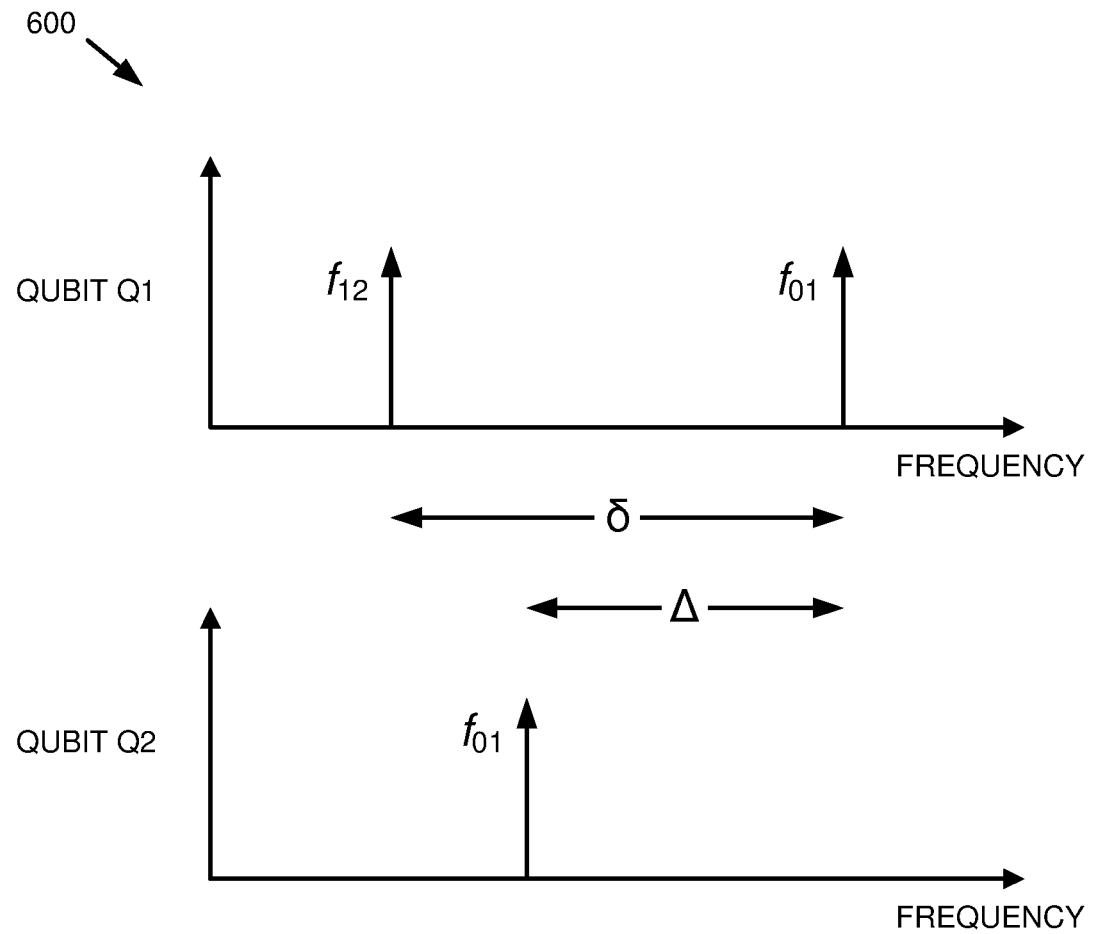
FIG. 6 is a diagram illustrating example collision windows that can be utilized in qubit frequency allocation according to various embodiments described herein.

In another aspect, the frequency configuration of a multi-qubit circuit can be defined at least in part by operational frequency ranges for respective qubits in the circuit and/or anharmonicity parameters associated with respective qubits in the circuit. Diagram 600 in FIG. 6 illustrates specific non-limiting example frequency ranges that can be employed by two qubits Q1 and Q2. As shown in diagram 600, $f_{01}$ denotes the first excitation frequency of the corresponding qubit and $f_{12}$ denotes the second excitation frequency. Further, the parameter $\delta$ denotes the anharmonicity of qubit Q1, e.g., the difference in frequency between the excitation frequencies $f_{01}$ and fie of qubit Q1. By way of non-limiting example, the anharmonicity $\delta$ of qubit Q1 can be between −300 to −350 MHz for a transmon qubit. Other anharmonicity parameters are also possible.

Based on the frequency configurations of qubits Q1 and Q2 as shown by diagram 600, respective types of collision windows can occur based on the anharmonicity $\delta$ of qubit Q1 as well as the frequency separation A between qubits Q1 and Q2. For instance, a first frequency collision type can occur when qubits Q1 and Q2 are on the same bus and share a common excitation frequency, e.g., such that $|\Delta|=0+/-a$, where a is a collision window size (e.g., $a=\delta/20$). A second frequency collision type between two qubits on the same bus can occur when the excitation frequency of the first qubit falls in the center of the excitation frequencies of the second qubit, e.g., $|\Delta|=-\delta/2+/-a$ (e.g., where $a=\delta/80$). A third frequency collision type between two qubits on the same bus can occur where the second excitation frequency of the first qubit collides with the first excitation frequency of the second qubit, e.g., $|\Delta|=-\delta+/-a$ (e.g., where $a=\delta/20$). A further frequency collision type can occur in a cross-resonance gate between qubits Q1 and Q2 if the difference in their excitation frequencies is sufficiently large, e.g., $|\Delta|>-1.05*\delta$.

It should be appreciated that the above collision types are provided merely as specific, non-limiting examples of collision types that could occur and that other collision types are possible. In an aspect, respective collision types can be defined in terms of 1) the frequency separation A between two qubits Q1 and Q2, 2) the coupling between respective qubits, 3) the function of respective qubits in the circuit, 4) a desired gate fidelity, which can relate to the collision window size a, 5) the presence of additional qubits Q3, Q4, etc., coupled to Q1 and/or Q2, and/or 6) any other suitable parameters.

In an aspect, the yield determination component 110 can further consider precision associated with fabricated qubit frequencies as an input to the statistical model described above. By way of example, the yield determination component 110 can directly measure the frequencies associated with a sample set of qubits to determine a frequency precision parameter.

Figure 7:
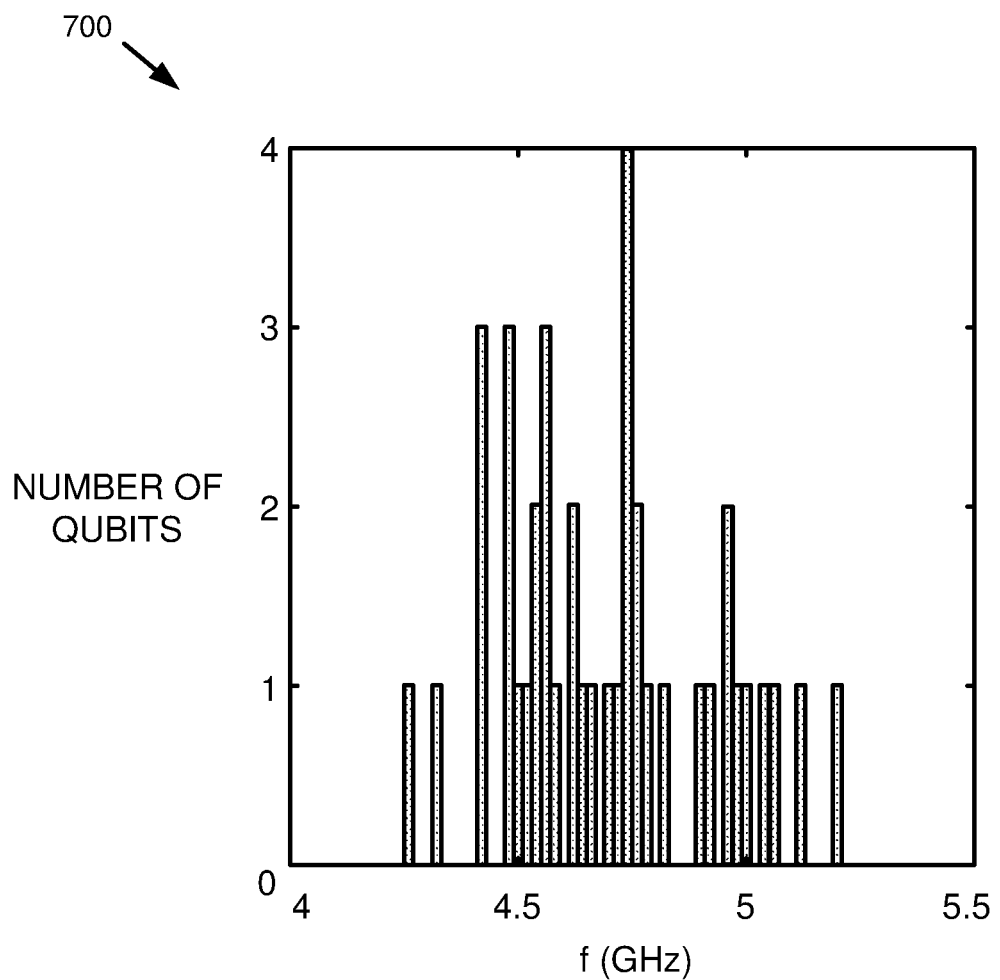
FIGS. 7-8 are diagrams illustrating respective example qubit frequency variance that can be accommodated according to various embodiments described herein.

Diagram 700 in FIG. 7 illustrates a histogram of the frequencies of 40 transmon-type qubits which were designed to be identical and fabricated to be identical according to a particular fabrication process. As shown by diagram 700, imperfections in the fabrication process cause the respective qubits to exhibit significant variations in operating frequency. Here the 40 qubits vary in frequency with a standard deviation of approximately 230 MHz. The variation in operating frequency exhibited by the qubits in diagram 700 demonstrates that even small variations in physical dimensions introduced during fabrication can have a nontrivial impact on operating frequency.

Figure 8:
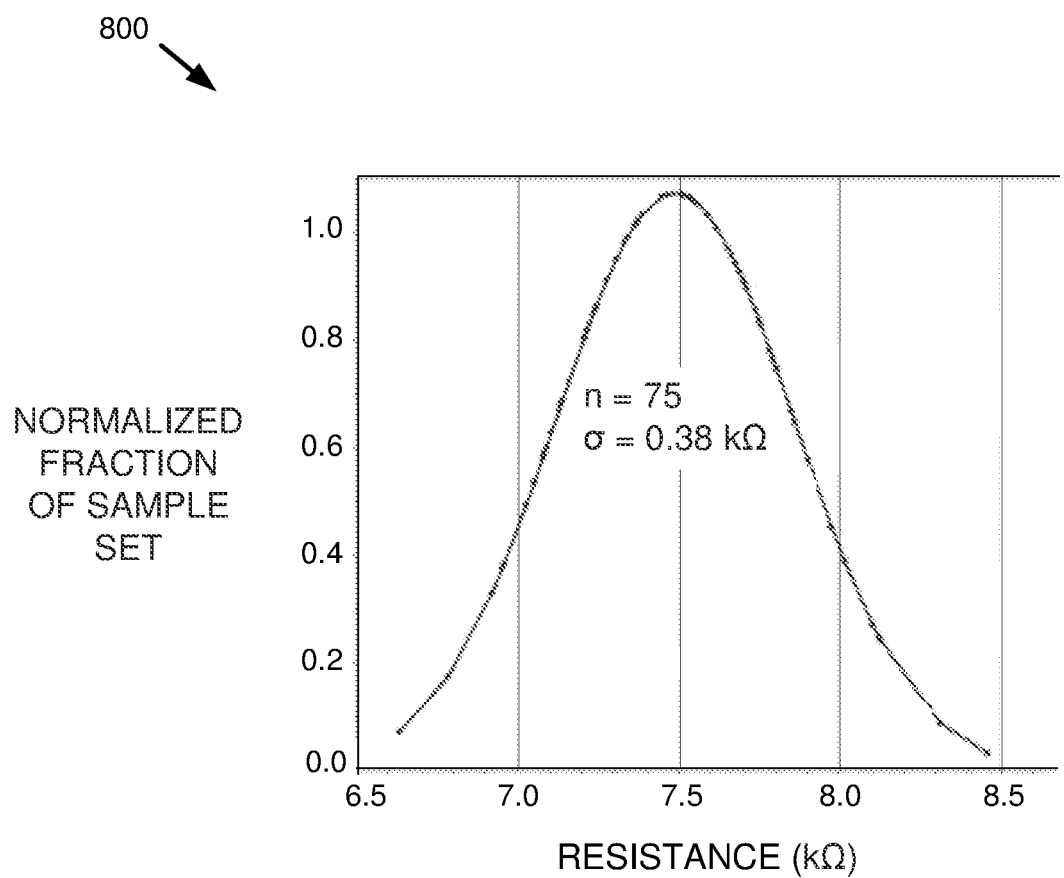

By way of an additional example, the yield determination component 110 can also consider empirical measurements of the variation in qubit components which can thereby vary qubit frequency. For instance, a Josephson tunnel junction can be implemented in a transmon qubit, and imprecision in fabricating this component will lead to imprecision in the qubit frequency. Diagram 800 in FIG. 8 illustrates a histogram of the resistances of a set of such tunnel junctions which were designed and fabricated by a particular fabrication process to have identical tunnel barrier resistances. As shown by diagram 800, imperfections in the fabrication process cause a variation in their resistances. From this variation, a variation can be predicted in any qubits that would be fabricated using this particular junction fabrication process.

Figure 9:
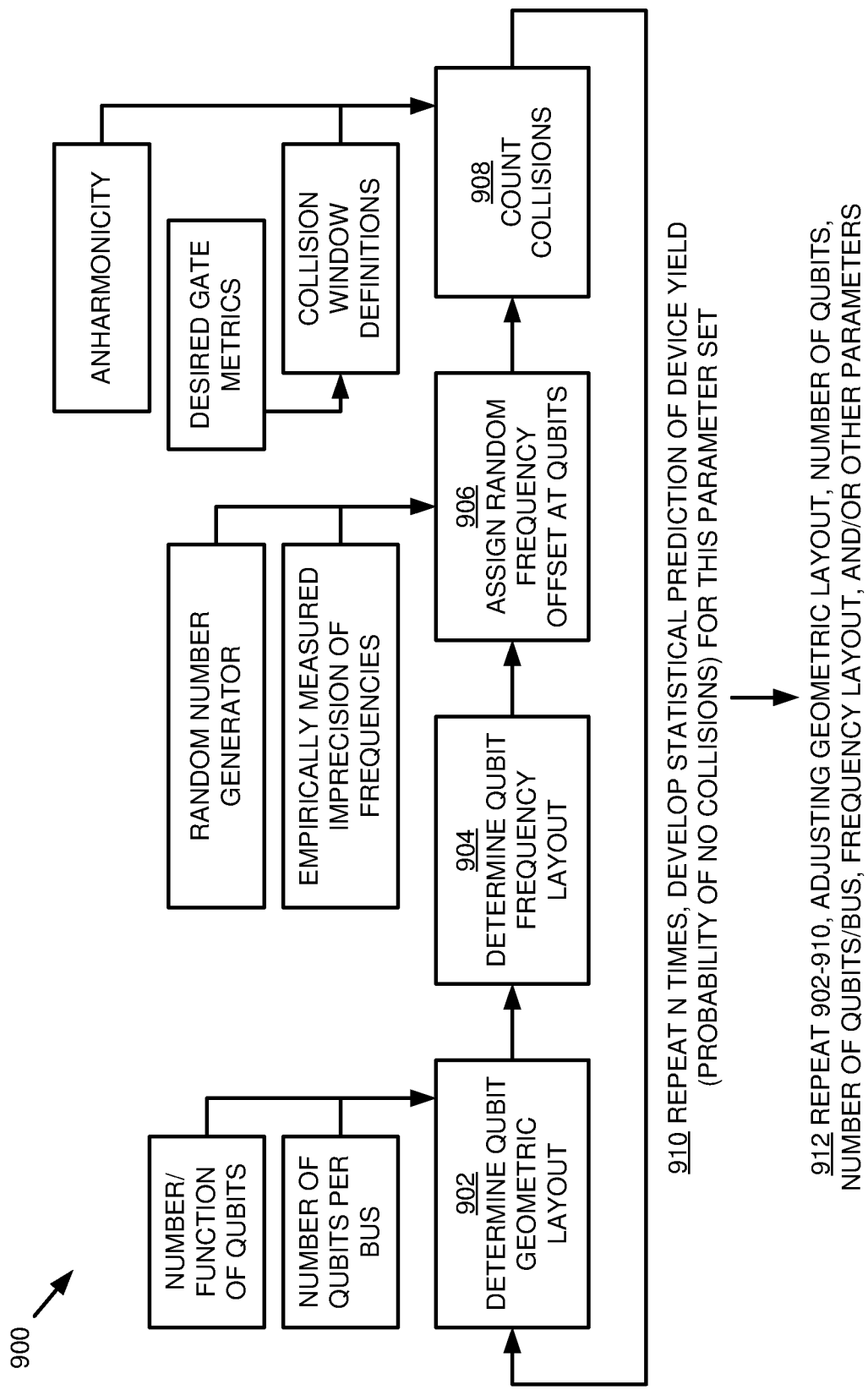
FIG. 9 is a diagram illustrating respective steps of an iterative process for generating a qubit chip configuration according to various embodiments described herein.

With reference next to FIG. 9, a diagram of an iterative process 900 for generating a qubit chip configuration according to various embodiments described herein is illustrated. While not shown in FIG. 9 for simplicity of illustration, it should be appreciated that the respective stages in process 900 can be implemented via a device operatively coupled to a processor, e.g., a processor utilized to implement the yield determination component 110, selection component 120, and/or configuration component 310, and/ or another suitable computing device. In an aspect, the diagram shown by FIG. 9 can further incorporate elements of the configuration component 310 and/or yield determination component 110 as described above with respect to FIGS. 1 and 3, and/or one or more components as will be discussed below with respect to FIGS. 10-13. It should be appreciated that the diagram shown by FIG. 9 offers an alternate representation of the process flow between such components.

In an aspect, process 900 can begin at stage 902 by determining (e.g., via the configuration component 310) a qubit geometric layout. As shown in FIG. 9, the qubit geometric layout can include factors such as a total number of qubits, functionality of respective qubits (e.g., data or ancilla), a number of qubits per bus, and/or other suitable factors as described above. Respective qubit geometric layouts that can be determined at stage 902 can include geometric layouts that are similar to those described above with respect to FIGS. 2, 4 and 5, and/or other suitable layouts comprising as many qubits as desired in any geometric arrangement desired for a given quantum computing circuit and application.

Next, at stage 904, a qubit frequency layout corresponding to the qubit geometric layout determined at stage 902 can be determined (e.g., by the configuration component 310). In an aspect, the qubit frequency layout determined at stage 904 can take into account the frequency properties of the respective qubits utilized in the geometric layout, e.g., the frequency properties described above with respect to FIG. 6 and/or other suitable properties. In another aspect, the frequency layout determined at stage 904 can utilize one or more fixed-frequency qubits and/or one or more tunable-frequency qubits.

At stage 906, random frequency offset(s) can be assigned (e.g., by the configuration component 310) at the qubits corresponding to the geometric and frequency layouts determined at stages 902 and 904, respectively. As shown by FIG. 9, the random frequency offsets assigned at stage 906 can be derived, at least in part, via a random number generator that utilizes one or more algorithms for random and/or pseudo-random number generation as known in the art. Also or alternatively, the frequency offsets assigned at stage 906 can be at least partially based on empirically measured frequency imprecision from one or more other simulations and/or sample fabrication runs, such as, e.g., the measurement data illustrated by FIGS. 7-8. In an aspect, the frequency offsets applied at stage 906 can be utilized to mimic the performance of a real qubit device in a simulated setting, thereby accommodating factors such as variations in physical dimensions and fabrication imprecision as generally described above.

At stage 908, the performance of a simulated qubit circuit generated according to the layouts determined at stages 902 and 904 and the frequency offsets assigned at stage 906 can be analyzed (e.g., by the yield determination component 110), and frequency collisions associated with the simulated circuit can be counted. In an aspect, collisions can be counted at stage 908 at least in part by defining frequency collision windows for respective qubits in the respective qubit configurations determined at stages 902 and 904 and counting the frequency collisions according to those frequency collision windows. Also or alternatively, parameters such as qubit anharmonicity, desired gate metrics, and/or other suitable metrics (e.g., other metrics as described above with respect to FIG. 6) could be used in counting frequency collisions at 908.

At stage 910, stages 902-908 can be repeated (e.g., by the configuration component 310 and/or the yield determination component 110) over a desired number N (e.g., where $N \geq 10^4$, etc.) of iterations. Based on these iterations, a statistical prediction of device yield (i.e., an estimated fabrication yield) can be determined (e.g., by the yield determination component 110) based on the number of frequency collisions observed at stage 908 of the respective iterations. In an aspect, the predicted device yield can be based on a calculated probability of zero collisions for a parameter set corresponding to a given iteration of stages 902-908, and/or other factors. Briefly returning to FIG. 1, an embodiment of system 100 in which the yield determination component 110 determines estimated device yield in the manner described with respect to stage 910 of process 900 can have the advantage of facilitating adjustment of respective qubit chip configurations by the yield determination component 110 to account for the frequency collisions observed at stage 908.

At the conclusion of the desired number of iterations at stage 910, process 900 can proceed to stage 912, in which stages 902-910 are repeated (e.g., by the configuration component 310 and/or the yield determination component 110) with adjustments to geometric layout, number of qubits, number of qubits per bus, frequency layout, and/or other parameters described above. In this manner, qubit parameters can be refined and estimated yield can be improved via iteration at stage 912 until a specified number of iterations and/or a desired device yield is reached. At the conclusion of stage 912, a set of qubit parameters that resulted in at least a threshold device yield, or a highest device yield, can be selected (e.g., by the selection component 120) for fabrication and/or other purposes.

Figure 10:
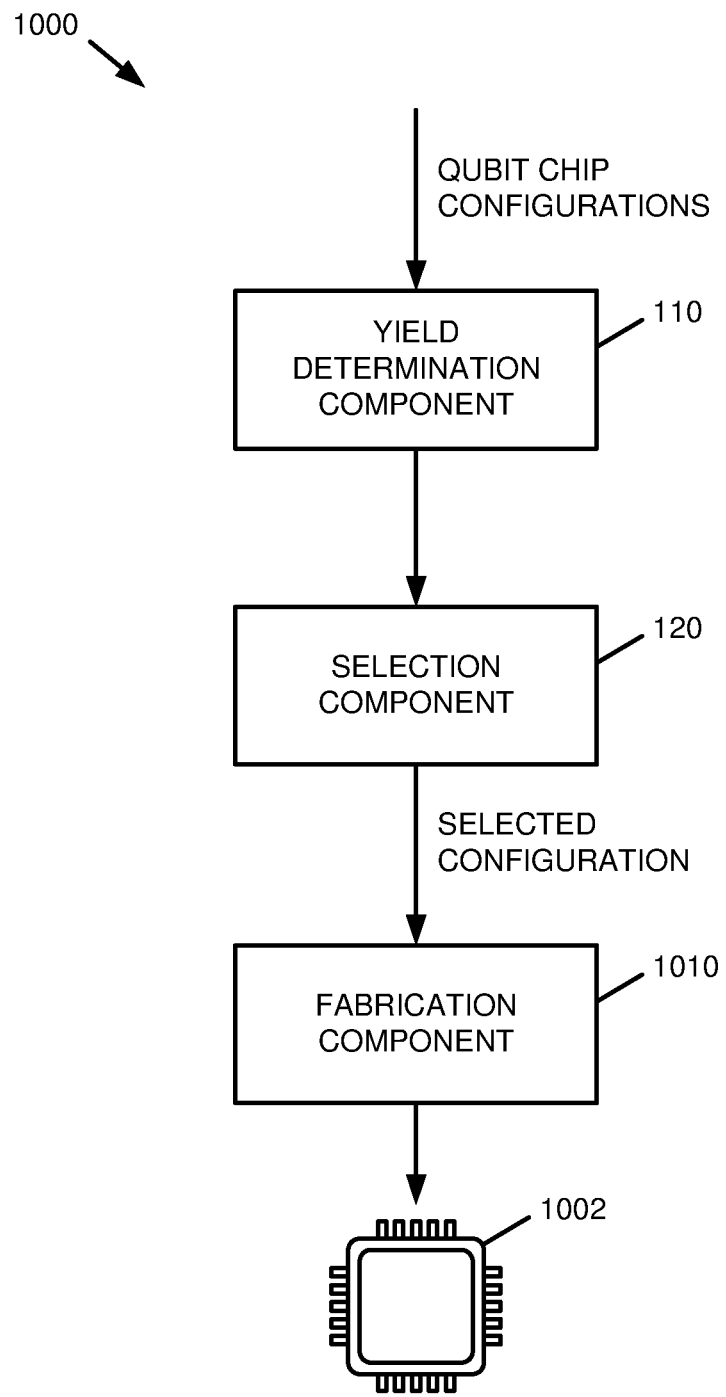
FIG. 10 is a block diagram of a system for fabricating a superconducting qubit chip according to various embodiments described herein.

Turning to FIG. 10, a block diagram of a system 1000 for fabricating a superconducting qubit chip 1002 according to various embodiments described herein is illustrated. Repetitive description of like elements employed in other embodiments described herein is omitted for sake of brevity. As shown in FIG. 10, system 1000 includes a yield determination component 110 and a selection component 120 for simulating qubit chip configurations and selecting a desired configuration, respectively, as described in accordance with various aspects above, as well as in accordance with the process described in FIG. 9.

In addition, system 1000 includes a fabrication component 1010 that fabricates a superconducting qubit chip 1002 according to a qubit chip configuration selected by the selection component 120. The fabrication component 1010 can be associated with a same computing device or combination of computing devices as the yield determination component 110 and the selection component 120 and/or a separate device. For instance, the fabrication component 1010 can be associated with one or more dedicated fabrication devices that are operable to receive a selected configuration from a device associated with the selection component 120 and fabricate a corresponding qubit chip 1002 according to the selected configuration using one or more techniques for qubit chip fabrication as known in the art. In an aspect, by simulating respective qubit chip specifications and/or configurations and selecting a configuration based on the simulation, the qubit chip configuration selected by the selection component 120 can result in improved resilience of the superconducting qubit chip 1002 to imperfections in fabrication by the fabrication component 1010.

Figure 11:
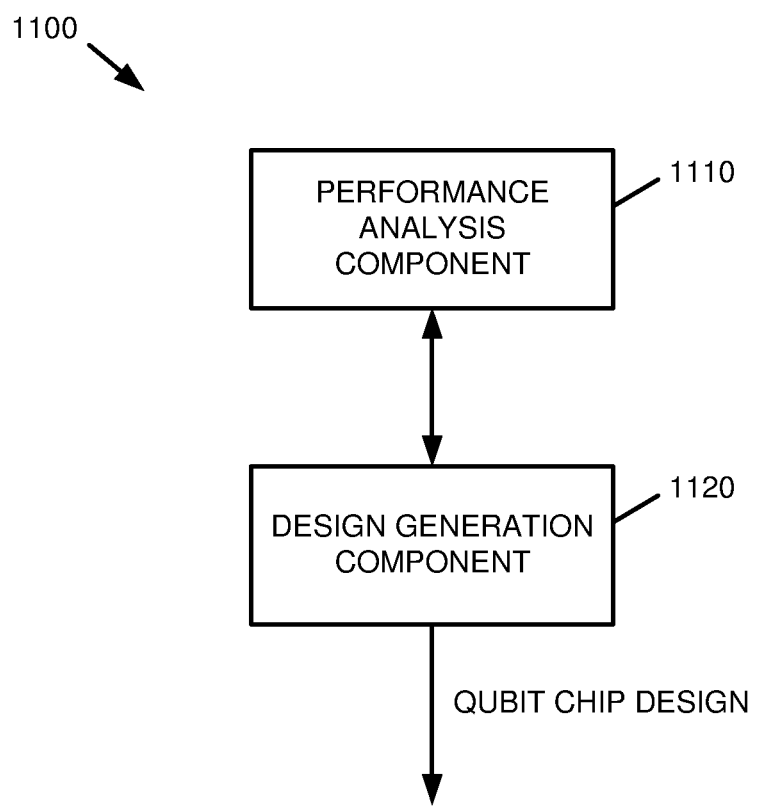
FIG. 11 is a block diagram of an alternative system that facilitates frequency allocation in multi-qubit circuits according to various embodiments described herein.

With reference next to FIG. 11, a block diagram of an alternative system 1100 that facilitates frequency allocation in multi-qubit circuits according to various embodiments described herein is illustrated. Repetitive description of like elements employed in other embodiments described herein is omitted for sake of brevity. In an aspect, system 1100 as shown in FIG. 11 provides an alternative representation of part of the process described in FIG. 9 for determining frequency allocation in multi-qubit circuits. As shown in FIG. 11, system 1100 includes a performance analysis component 1110 that determines operation metrics for respective qubit chip features by analyzing simulated performance of the respective qubit chip features at respective frequency offsets. The qubit chip features utilized by the performance analysis component 1110 can include, but are not limited to, geometric features such as a total number of qubits, functionality of respective qubits (e.g., data or ancilla, etc.), a number of qubits per bus, or the like. Also or alternatively, the qubit chip features can include, but are not limited to, frequency features such as operational frequency ranges for respective qubits, anharmonicity parameters associated with respective qubits, whether respective qubits have a fixed frequency or a tunable frequency, etc.

In an aspect, the performance analysis component 1110 can analyze performance of a simulated qubit chip with a complete set of assigned parameters, e.g., in a similar manner to that described above with respect to FIG. 9. Alternatively, the performance analysis component 1110 can analyze performance of one or more individual qubits with respect to a complete set of parameters or a partial set of parameters. For instance, the performance analysis component 1110 could in some cases analyze performance associated with respective geometric qubit layouts without respect to particular frequency layouts, or vice versa. The performance analysis component could also or alternatively analyze performance associated with one or more qubits that form a portion of a qubit circuit that includes additional, non-analyzed qubits. Other analysis techniques could also be used.

As further shown by FIG. 11, system 1100 further includes a design generation component 1120 that generates a superconducting qubit chip design using one or more of the respective qubit chip features analyzed by the performance analysis component 1110 based on the corresponding operation metrics determined by the performance analysis component 1110. In an aspect, the design generation component 1120 can select a qubit chip design based on respective designs analyzed by the performance analysis component 1110. Alternatively, the performance analysis component 1110 can analyze performance of respective qubit circuit parameters (e.g., geometric configuration, frequency configuration, etc.), such that the design generation component 1120 can construct a qubit chip design based on the individual parameters utilized by the performance analysis component 1110. In another example, the performance analysis component 1110 can analyze performance associated with one or more portions or sub-circuits of a given qubit circuit, and the design generation component 1120 can construct a qubit chip design based on one or more sub-circuits analyzed by the performance analysis component 1110 and/or predefined sub-circuits, e.g., known efficient sub-circuit designs stored by a memory or data store associated with a computing device that implements system 1100. Other techniques are also possible.

Figure 12:
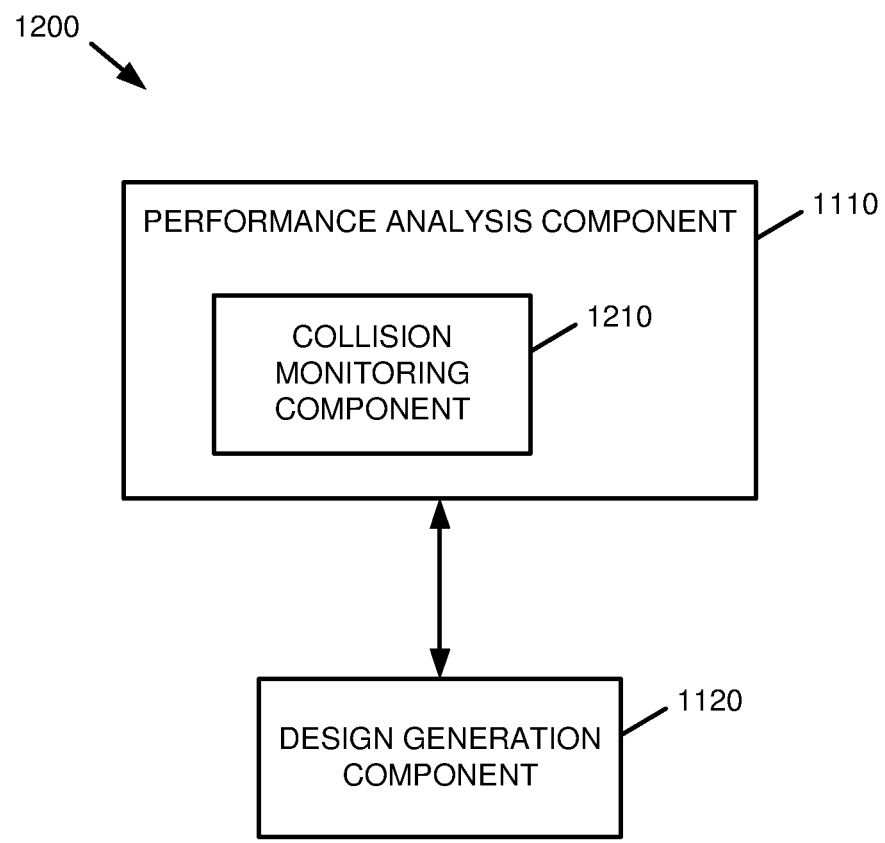
FIG. 12 is a block diagram of a system that facilitates frequency allocation in multi-qubit circuits via simulated collision monitoring according to various embodiments described herein.

Turning to FIG. 12, a block diagram of a system 1200 that facilitates frequency allocation in multi-qubit circuits via simulated collision monitoring according to various embodiments described herein is illustrated. Repetitive description of like elements employed in other embodiments described herein is omitted for sake of brevity. In an aspect, system 1200 as shown in FIG. 12 provides an alternative representation portions of the collision monitoring and design procedures depicted in FIG. 9. As shown in FIG. 12, system 1200 includes a collision monitoring component 1210 associated with the performance analysis component 1110 that can identify and/or otherwise monitor frequency collisions associated with simulations and/or other operations carried out by the performance analysis component 1110. In an aspect, the collision monitoring component 1210 can define frequency collision windows for respective qubits corresponding to the qubit chip features analyzed by the performance analysis component 1110, e.g., such as one or more of the collision windows as described above with respect to FIG. 6 and/or other collision windows as appropriate. The collision monitoring component 1210 can then identify collisions between the respective qubits based on the defined frequency collision windows. The collision monitoring component can employ repeated trials introducing statistical variation of parameters into the model in order to derive a probability of collisions occurring and probability of device yield, as depicted alternatively in FIG. 9.

Figure 13:
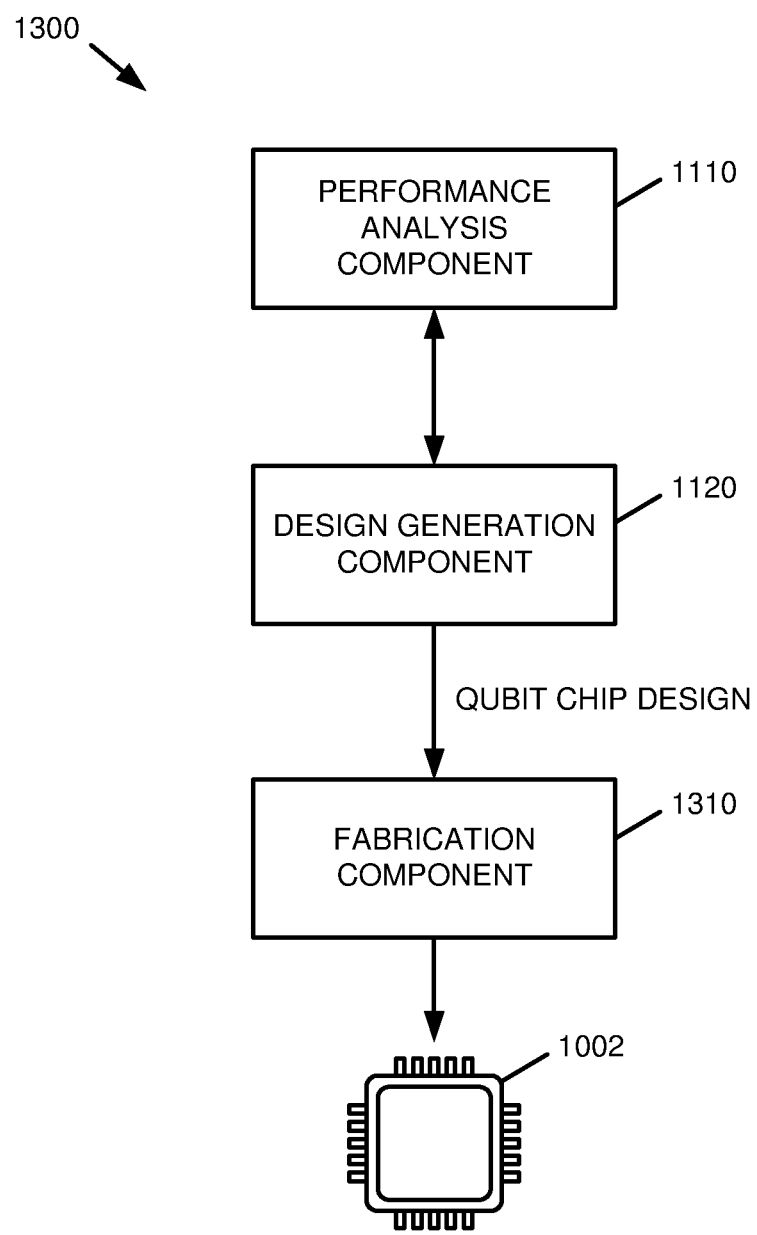
FIG. 13 is a block diagram of an alternative system for fabricating a superconducting qubit chip according to various embodiments described herein.

With reference now to FIG. 13, a block diagram of an alternative system 1300 for fabricating a superconducting qubit chip 1002 according to various embodiments described herein is illustrated. Repetitive description of like elements employed in other embodiments described herein is omitted for sake of brevity. As shown in FIG. 13, system 1300 includes a performance analysis component 1110 and a design generation component 1120 that can generate a qubit chip design as described above with respect to FIGS. 11-12 and with respect to the alternative depiction of this process as shown in FIG. 9. Additionally, system 1300 includes a fabrication component 1310 that can fabricate a superconducting qubit chip 1002 according to the superconducting qubit chip design generated by the design generation component 1120. In an aspect, the fabrication component 1310 can operate similarly to the fabrication component 1010 shown in system 1000 and/or differently. For instance, the type or nature of information obtained by the fabrication component 1310 from the design generation component 1120 can be different than that of corresponding information received by the fabrication component 1010 of system 1000 from the selection component 120, and the fabrication component 1310 can utilize various techniques to account for these differences. Similar to the fabrication component 1010 of system 1000 as described above, the fabrication component 1310 of system 1300 can be implemented via a same device as the performance analysis component 1110 and/or the design generation component 1120 and/or a different device.

In an aspect, a superconducting qubit chip 1002 resulting from operation of the fabrication component 1310 can be similar in functionality to that produced by the fabrication component 1010 of system 1000. In another aspect, the fabrication component 1310 can produce superconducting qubit chip 1002 with improved resilience to imperfections in fabrication by the fabrication component 1310 by utilizing the qubit design generated by the design generation component 1120.

Figure 14:
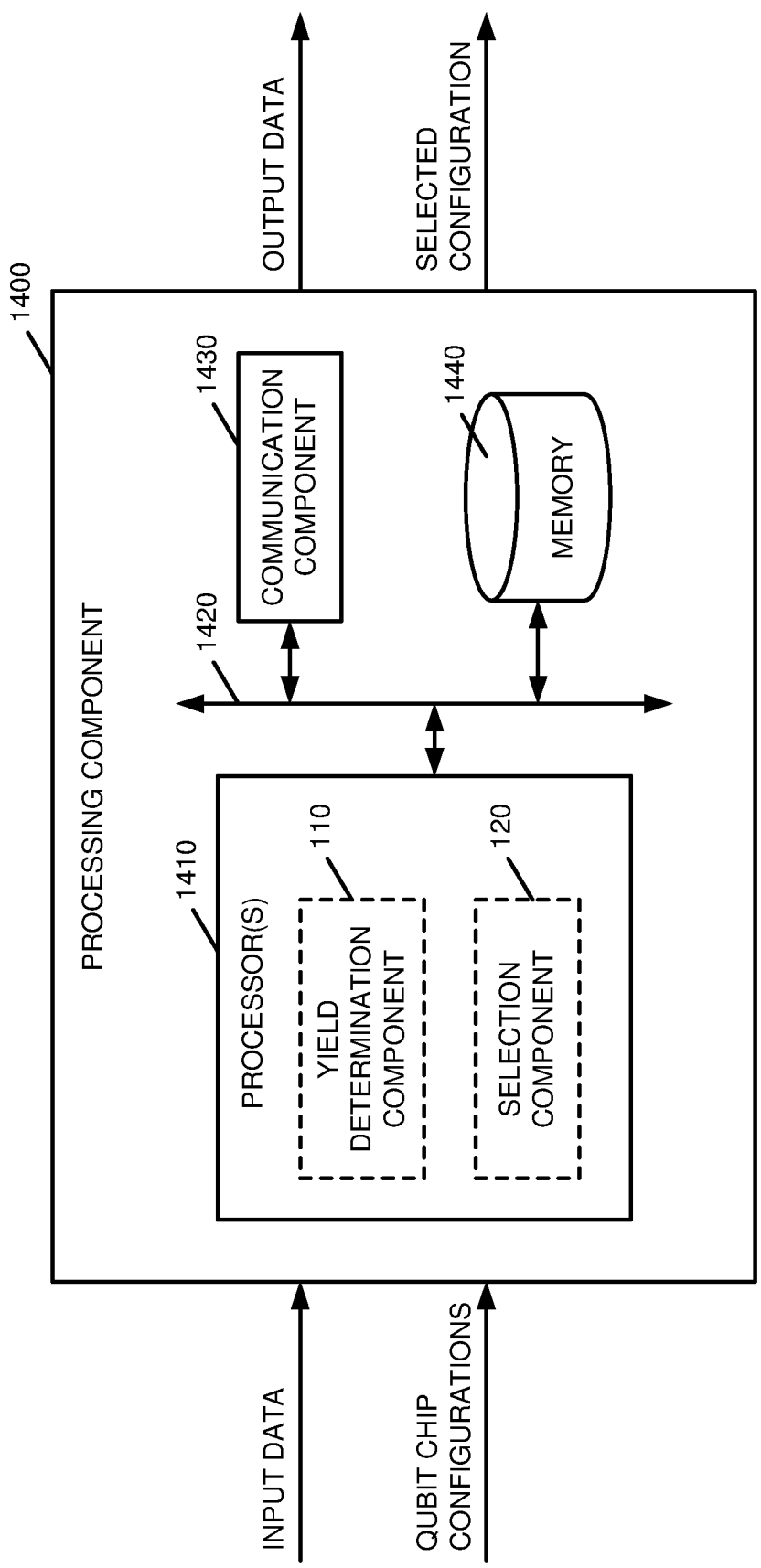
FIGS. 14-15 are diagrams of respective example, non-limiting processing components according to one or more embodiments described herein.

Referring next to FIG. 14, a processing component 1400 that can be utilized to implement one or more aspects described herein is illustrated in accordance with one or more embodiments. Repetitive description of like elements employed in other embodiments described herein is omitted for sake of brevity.

As shown in FIG. 14, the processing component 1400 can be associated with at least one processor 1410 (e.g., a central processing unit, a graphical processing unit, etc.), which can be utilized to implement one or more of the yield determination component 110 and/or selection component 120 as described above. The processor(s) 1410 can be connected via a data bus 1420 to one or more additional sub-components of the processing component 1400, such as a communication component 1430 and/or a memory 1440. While the communication component 1430 is illustrated as implemented separately from the processor(s) 1410, the processor(s) 1410 in some embodiments can additionally be used to implement the communication component 1430. In still other embodiments, the communication component 1430 can be external to the processing component 1400 and communicate with the processing component 1400 via a separate communication link.

The memory 1440 can be utilized by the processing component 1400 to store data utilized by the processing component 1400 in accordance with one or more embodiments described herein. Additionally or alternatively, the memory 1440 can have stored thereon machine-readable instructions that, when executed by the processing component 1400, cause the processing component (and/or one or more processors 1410 thereof) to implement the yield determination component 110 and/or selection component 120 as described above.

Figure 15:
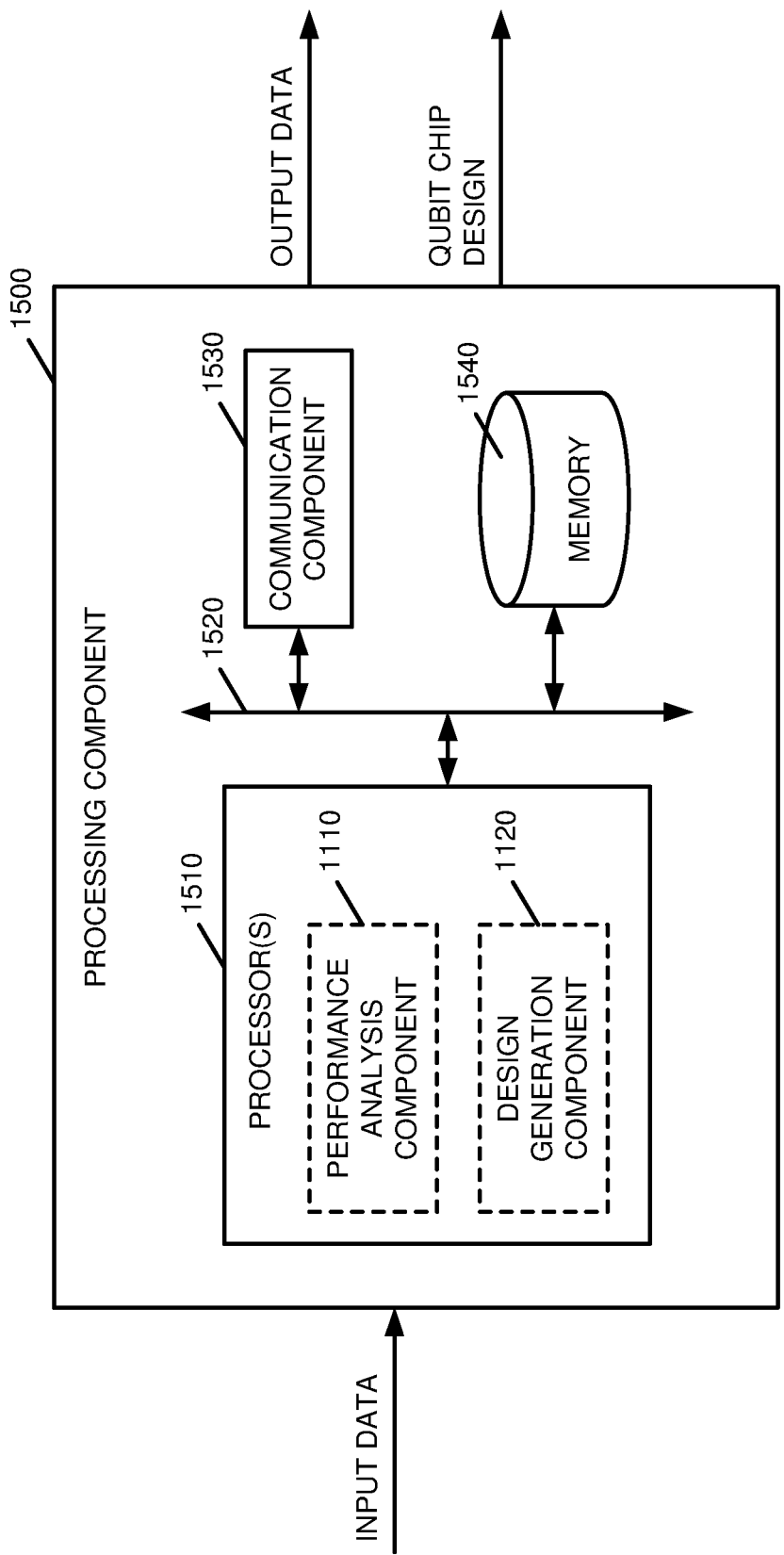

FIG. 15 illustrates another processing component 1500 that can be utilized to implement one or more aspects described herein in accordance with one or more embodiments. Repetitive description of like elements employed in other embodiments described herein is omitted for sake of brevity.

As shown in FIG. 15, the processing component 1500 can be associated with at least one processor 1510, which can be utilized to implement one or more of the performance analysis component 1110 and/or design generation component 1120 as described above. The processor(s) 1510 can be connected via a data bus 1520 to one or more additional sub-components of the processing component 1500, such as a communication component 1530 and/or a memory 1540. In an aspect, the communication component 1530 can be configured in a similar manner to the communication component 1430 described above with respect to FIG. 14.

Similar to the memory 1440 described above with respect to FIG. 14, the memory 1540 can be utilized by the processing component 1500 to store data utilized by the processing component 1500 in accordance with one or more embodiments described herein. Additionally or alternatively, the memory 1540 can have stored thereon machine-readable instructions that, when executed by the processing component 1500, cause the processing component (and/or one or more processors 1510 thereof) to implement the performance analysis component 1110 and/or design generation component 1120 as described above.

In various embodiments, the processing components 1400, 1500 shown in FIGS. 14-15 can be or include hardware, software (e.g., a set of threads, a set of processes, software in execution, etc.) or a combination of hardware and software that performs a computing task (e.g., a computing task associated with received data). For example, processing components 1400, 1500 can perform simulations of large and/or complex multi-qubit circuits and/or perform other operations that cannot be performed by a human (e.g., are greater than the capability of a human mind). For example, the amount of data processed, the speed of processing of the data and/or the data types processed by processing components 1400, 1500 over a certain period of time can be respectively greater, faster and different than the amount, speed and data type that can be processed by a single human mind over the same period of time. For example, data processed by processing components 1400, 1500 can be raw data (e.g., raw textual data, raw numerical data, etc.) and/or compressed data (e.g., compressed textual data, compressed numerical data, etc.) associated with one or more computing devices. Moreover, processing components 1400, 1500 can be fully operational towards performing one or more other functions (e.g., fully powered on, fully executed, etc.) while also processing the above-referenced data.

Figure 16:
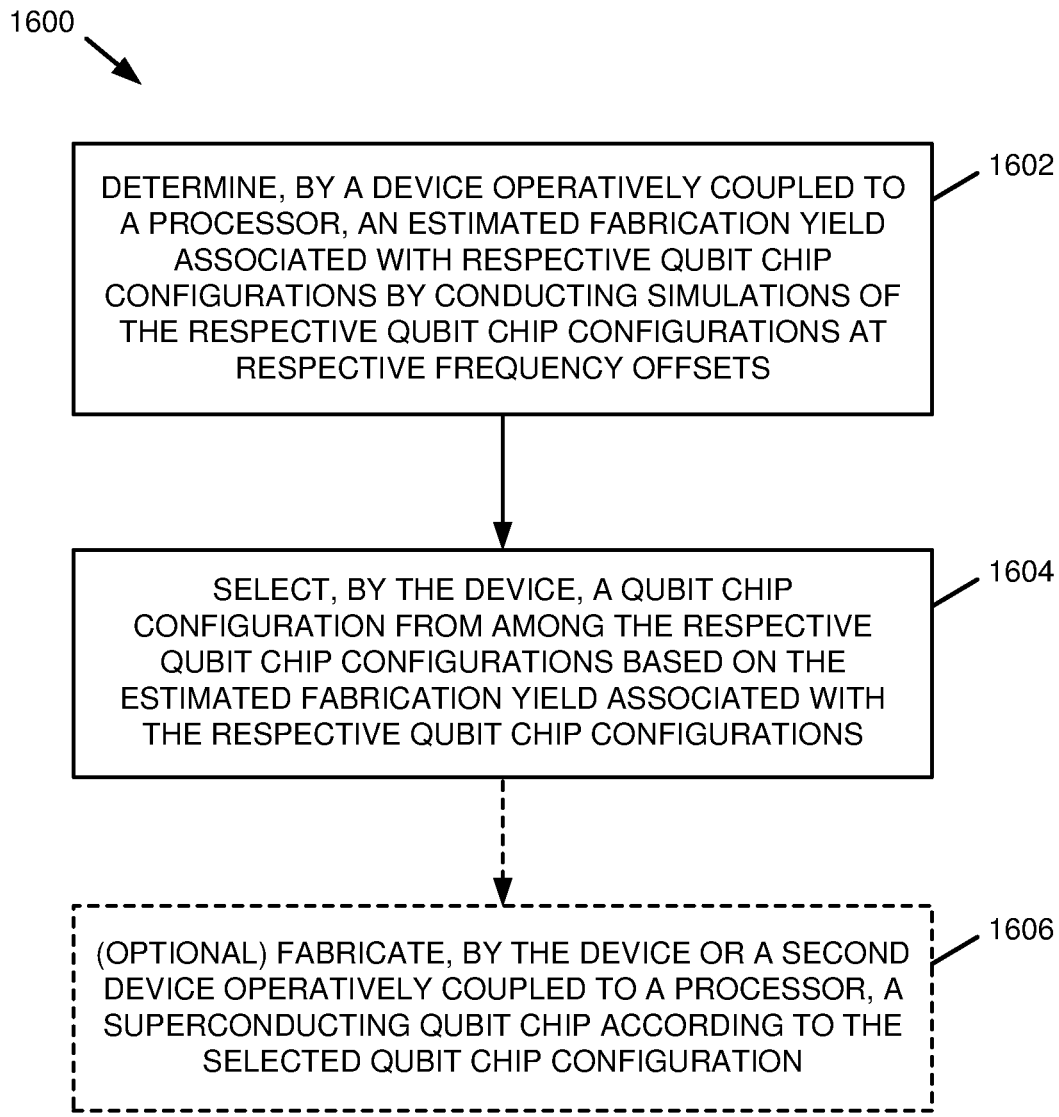
FIGS. 16-17 are flow diagrams of respective example, non-limiting computer-implemented methods that facilitates frequency allocation in multi-qubit circuits according to one or more embodiments described herein.

FIG. 16 illustrates a flow diagram of an example, non-limiting computer-implemented method 1600 that facilitates frequency allocation in multi-qubit circuits according to one or more embodiments described herein. Repetitive description of like elements employed in other embodiments described herein is omitted for sake of brevity.

At 1602, a device operatively coupled to a processor (e.g., processor(s) 1410 of a processing component 1400) can determine (e.g., by a yield determination component 110) an estimated fabrication yield associated with respective qubit chip configurations by conducting simulations of the respective qubit chip configurations at respective frequency offsets.

At 1604, the device can select (e.g., by a selection component 120) a qubit chip configuration from among the respective qubit chip configurations utilized at 1602 based on the estimated fabrication yield associated with the respective qubit chip configurations as further determined at 1602.

In an aspect, method 1600 can conclude upon selection of a qubit chip configuration at 1604. In another aspect, method 1600 can optionally continue to 1606, in which the device, or a second device operatively coupled to a processor, can fabricate (e.g., by a fabrication component 1010) a superconducting qubit chip according to the qubit chip configuration selected at 1604.

Figure 17:
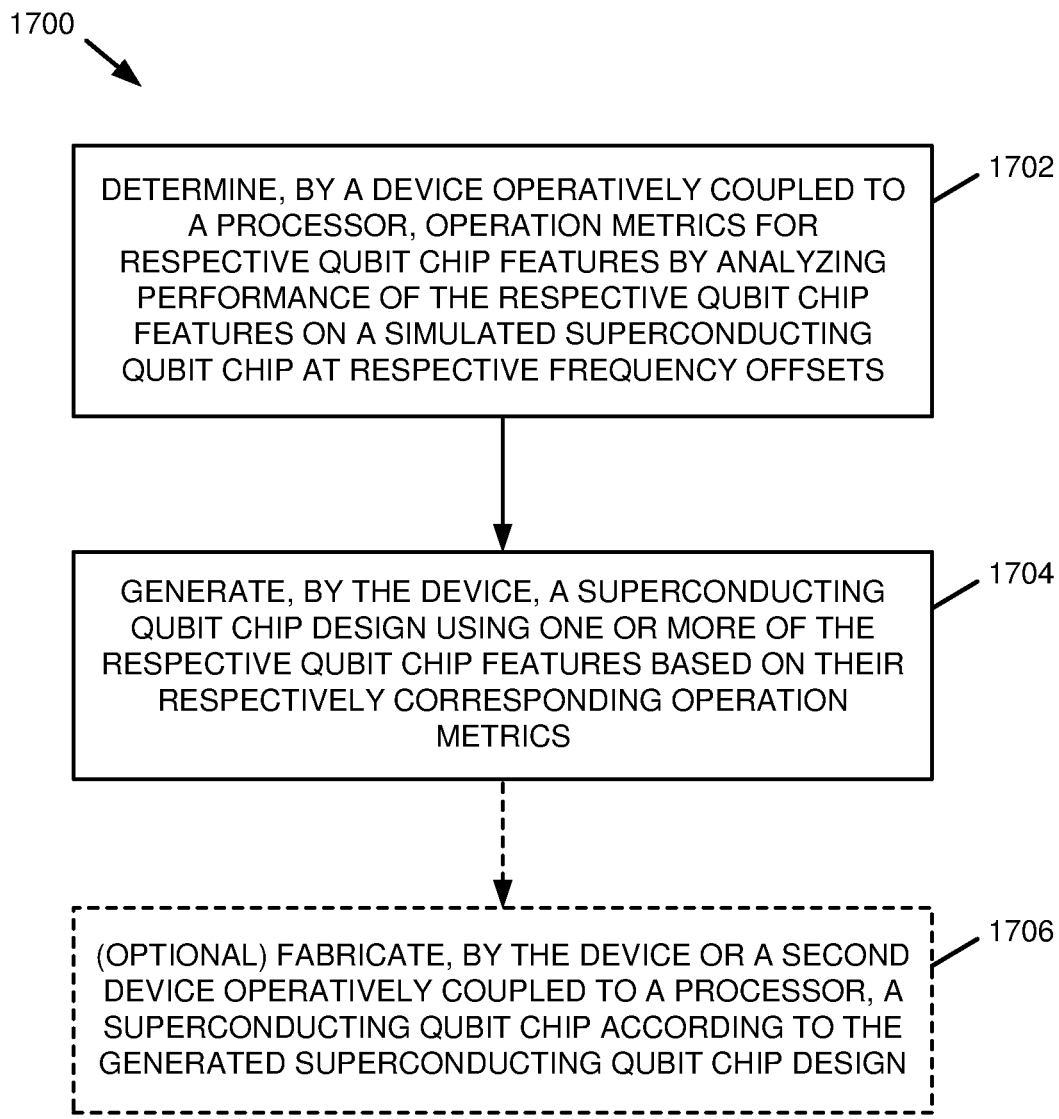

FIG. 17 illustrates a flow diagram of an alternative example, non-limiting computer-implemented method 1700 that facilitates frequency allocation in multi-qubit circuits according to one or more embodiments described herein. Repetitive description of like elements employed in other embodiments described herein is omitted for sake of brevity.

At 1702, a device operatively coupled to a processor (e.g., processor(s) 1510 of a processing component 1500) can determine (e.g., by a performance analysis component 1110) operation metrics for respective qubit chip features by analyzing simulated performance of the respective qubit chip features at respective frequency offsets.

At 1704, the device can generate (e.g., by a design generation component 1120) a superconducting chip design using one or more of the respective qubit features based on their respectively corresponding operation metrics.

In an aspect, method 1700 can conclude upon generation of a qubit chip design at 1704. In another aspect, method 1700 can optionally continue to 1706, in which the device, or a second device operatively coupled to a processor, can fabricate (e.g., by a fabrication component 1310) a superconducting qubit chip according to the qubit chip design generated at 1704.

For simplicity of explanation, the computer-implemented methodologies are depicted and described as a series of acts.

It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies can alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Moreover, because configuration of data packet(s) and/or communication between processing components is established from a combination of electrical and mechanical components and circuitry, a human is unable to replicate or perform the subject data packet configuration and/or the subject communication between processing components. For example, a human is unable to generate data for transmission over a wired network and/or a wireless network between processing components, etc. Moreover, a human is unable to packetize data that can include a sequence of bits corresponding to information generated during one or more processes as described above, transmit data that can include a sequence of bits corresponding to information generated during one or more processes as described above, etc.

Figure 18:
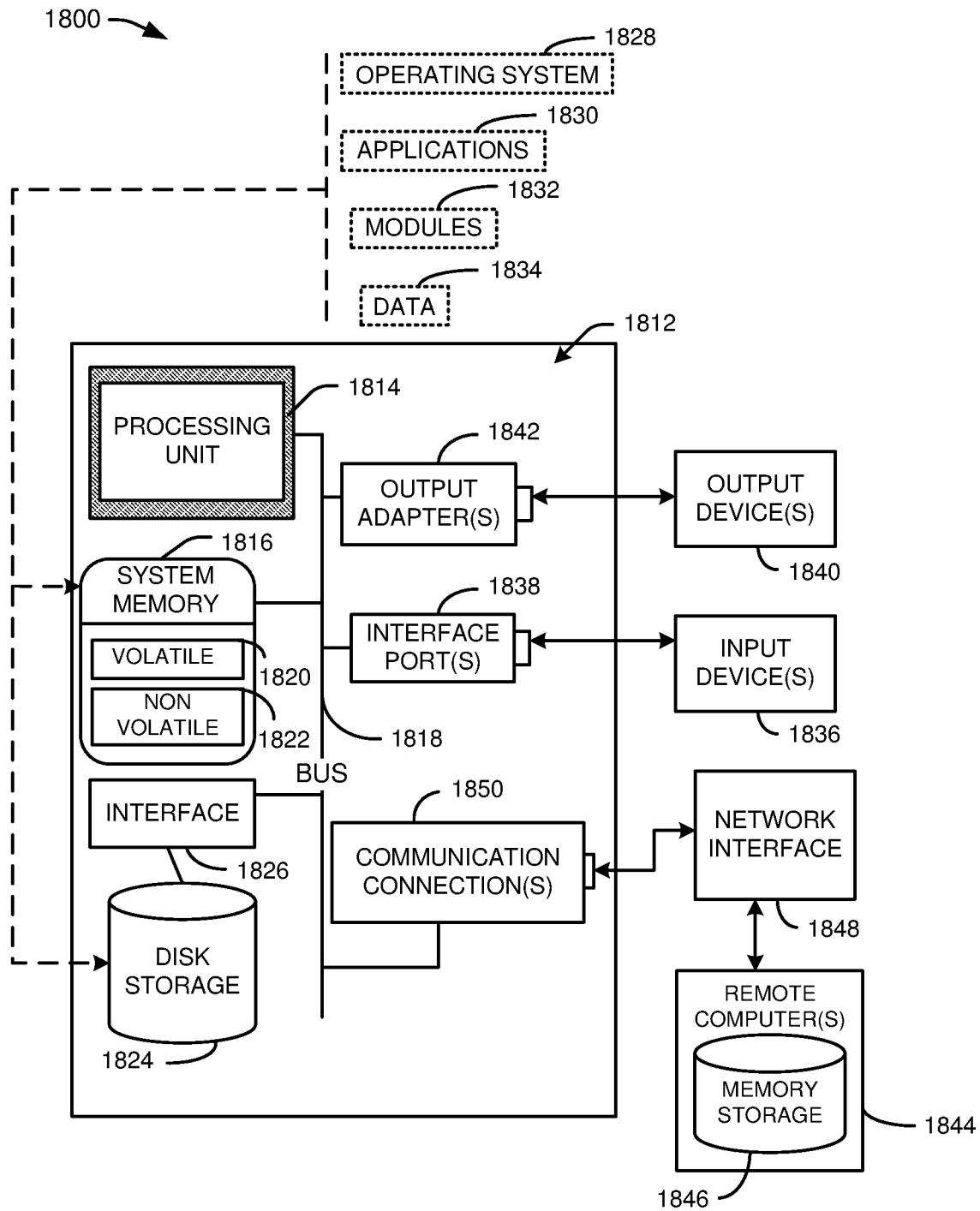
FIG. 18 is a block diagram of an example, non-limiting operating environment in which one or more embodiments described herein can be implemented.

In order to provide a context for the various aspects of the disclosed subject matter, FIG. 18 as well as the following discussion are intended to provide a general description of a suitable environment in which the various aspects of the disclosed subject matter can be implemented. FIG. 18 illustrates a block diagram of an example, non-limiting operating environment in which one or more embodiments described herein can be facilitated. Repetitive description of like elements employed in other embodiments described herein is omitted for sake of brevity. With reference to FIG. 18, a suitable operating environment 1800 for implementing various aspects of this disclosure can also include a computer 1812. The computer 1812 can also include a processing unit 1814, a system memory 1816, and a system bus 1818. The system bus 1818 couples system components including, but not limited to, the system memory 1816 to the processing unit 1814. The processing unit 1814 can be any of various available processors. Dual microprocessors and other multiprocessor architectures also can be employed as the processing unit 1814. The system bus 1818 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 1816 can also include volatile memory 1820 and nonvolatile memory 1822. The basic input/output system (BIOS), containing the basic routines to transfer information between elements within the computer 1812, such as during start-up, is stored in nonvolatile memory 1822. By way of illustration, and not limitation, nonvolatile memory 1822 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM). Volatile memory 1820 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1812 can also include removable/non-removable, volatile/non-volatile computer storage media. FIG. 18 illustrates, for example, a disk storage 1824. Disk storage 1824 can also include, but is not limited to, devices like a magnetic disk drive, solid state drive, floppy disk drive, tape drive, Jaz drive, Zip drive, LS-100 drive, flash memory card, or memory stick. The disk storage 1824 also can include storage media separately or in combination with other storage media including, but not limited to, an optical disk drive such as a compact disk ROM device (CD-ROM), CD recordable drive (CD-R Drive), CD rewritable drive (CD-RW Drive), a digital versatile disk ROM drive (DVD-ROM), or a Blu-ray disc drive. To facilitate connection of the disk storage 1824 to the system bus 1818, a removable or non-removable interface is typically used, such as interface 1826. FIG. 18 also depicts software that acts as an intermediary between users and the basic computer resources described in the suitable operating environment 1800. Such software can also include, for example, an operating system 1828. Operating system 1828, which can be stored on disk storage 1824, acts to control and allocate resources of the computer 1812. System applications 1830 take advantage of the management of resources by operating system 1828 through program modules 1832 and program data 1834, e.g., stored either in system memory 1816 or on disk storage 1824. It is to be appreciated that this disclosure can be implemented with various operating systems or combinations of operating systems. A user enters commands or information into the computer 1812 through input device(s) 1836. Input devices 1836 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1814 through the system bus 1818 via interface port(s) 1838. Interface port(s) 1838 include, for example, a serial port, a parallel port, a game port, and a universal serial bus (USB). Output device(s) 1840 use some of the same type of ports as input device(s) 1836. Thus, for example, a USB port can be used to provide input to computer 1812, and to output information from computer 1812 to an output device 1840. Output adapter 1842 is provided to illustrate that there are some output devices 1840 like monitors, speakers, and printers, among other output devices 1840, which require special adapters. The output adapters 1842 include, by way of illustration and not limitation, video and sound cards that provide a means of connection between the output device 1840 and the system bus 1818. It should be noted that other devices and/or systems of devices provide both input and output capabilities such as remote computer(s) 1844.

Computer 1812 can operate in a networked environment using logical connections to one or more remote computers, such as remote computer(s) 1844. The remote computer(s) 1844 can be a computer, a server, a router, a network PC, a workstation, a microprocessor based appliance, a peer device or other common network node and the like, and typically can also include many or all of the elements described relative to computer 1812. For purposes of brevity, only a memory storage device 1846 is illustrated with remote computer(s) 1844. Remote computer(s) 1844 is logically connected to computer 1812 through a network interface 1848 and then physically connected via communication connection 1850. Network interface 1848 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1850 refers to the hardware/software employed to connect the network interface 1848 to the system bus 1818. While communication connection 1850 is shown for illustrative clarity inside computer 1812, it can also be external to computer 1812. The hardware/software for connection to the network interface 1848 can also include, for exemplary purposes only, internal and external technologies such as, modems including regular telephone grade modems, cable modems and DSL modems, ISDN adapters, and Ethernet cards.

Various embodiments of the present can be a system, a method, an apparatus and/or a computer program product at any possible technical detail level of integration. The computer program product can include a computer readable storage medium (or media) having computer readable program instructions thereon for causing a processor to carry out one or more aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of one or more embodiments of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform one or more aspects of the present invention.

One or more aspects of the present invention are described herein with reference to flowchart illustrations and/or block diagrams of methods, apparatus (systems), and computer program products according to one or more embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While portions of the subject matter have been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Various modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system comprising:
    a memory that stores computer executable components; and
    a processor that executes computer executable components stored in the memory, wherein the computer executable components comprise:
    a performance analysis component that analyzes simulated performance of respective qubit chip features and determines operation metrics for the respective qubit chip features at respective frequency offsets; and
    a design generation component that generates a superconducting qubit chip design using one or more of the respective qubit chip features based on the respective operation metrics determined by the performance analysis component.

2. The system of claim 1, wherein the respective qubit chip features comprise at least one of total number of qubits, functionality of respective qubits, or a number of qubits per bus.

3. The system of claim 1, wherein the respective qubit chip features comprise at least one of operational frequency ranges for respective qubits or anharmonicity parameters associated with the respective qubits.

4. The system of claim 1, wherein the computer executable components further comprise:
    a collision monitoring component that defines frequency collision windows for respective qubits corresponding to the qubit chip features.

5. The system of claim 4, wherein the collision monitoring component identifies collisions between the respective qubits based on the frequency collision windows.

6. The system of claim 1, wherein the computer executable components further comprise:
    a fabrication component that fabricates a superconducting qubit chip according to the superconducting qubit chip design generated by the design generation component, wherein the superconducting qubit chip design generated by the design generation component results in improved resilience of the superconducting qubit chip to imperfections in fabrication by the fabrication component.

7. A computer-implemented method comprising:
    determining, by a device operatively coupled to a processor, operation metrics for respective qubit chip features by analyzing simulated performance of the respective qubit chip features at respective frequency offsets; and
    generating, by the device, a superconducting qubit chip design using one or more of the respective qubit chip features based on their respectively corresponding operation metrics.

8. The computer-implemented method of claim 7, wherein the determining comprises:
    defining, by the device, frequency collision windows for respective qubits corresponding to the qubit chip features.

9. The computer-implemented method of claim 8, wherein the determining further comprises:
    identifying, by the device, collisions between the respective qubits based on the frequency collision windows.

10. The computer-implemented method of claim 7, wherein the generating results in a generated superconducting qubit chip design, further comprising:
    fabricating, by the device, a superconducting qubit chip according to the generated superconducting qubit chip design.

11. The computer-implemented method of claim 7, wherein the respective qubit chip features comprise at least one of total number of qubits, functionality of respective qubits, or a number of qubits per bus.

12. The computer-implemented method of claim 7, wherein the respective qubit chip features comprise at least one of operational frequency ranges for respective qubits or anharmonicity parameters associated with the respective qubits.

13. The computer-implemented method of claim 7, further comprising fabricating a superconducting qubit chip according to the superconducting qubit chip design, wherein the superconducting qubit chip design results in improved resilience of the superconducting qubit chip to imperfections in fabrication.

14. A computer program product for designing a superconducting qubit chip, the computer program product comprising a computer readable storage medium having program instructions embodied therewith, the program instructions executable by a processor to cause the processor to:

determine, by a device operatively coupled to a processor, operation metrics for respective qubit chip features by analyzing simulated performance of the respective qubit chip features at respective frequency offsets; and generate, by the device, a superconducting qubit chip design using one or more of the respective qubit chip features based on their respectively corresponding operation metrics.

15. The computer program product of claim 14, wherein the program instructions further cause the processor to:

define, by the device, frequency collision windows for respective qubits corresponding to the qubit chip features.

16. The computer program product of claim 15, wherein the program instructions further cause the processor to:

identify, by the device, collisions between the respective qubits based on the frequency collision windows.

17. The computer program product of claim 14, wherein the program instructions further cause the processor to:

fabricate, by the device, a superconducting qubit chip according to the generated superconducting qubit chip design.

18. The computer program product of claim 14, wherein the respective qubit chip features comprise at least one of total number of qubits, functionality of respective qubits, or a number of qubits per bus.

19. The computer program product of claim 14, wherein the respective qubit chip features comprise at least one of operational frequency ranges for respective qubits or anharmonicity parameters associated with the respective qubits.

20. The computer program product of claim 14, wherein the program instructions further cause the processor to:

fabricate a superconducting qubit chip according to the superconducting qubit chip design, wherein the superconducting qubit chip design results in improved resilience of the superconducting qubit chip to imperfections in fabrication.

* * * * *